(12) United States Patent
Sugawara et al.

(10) Patent No.: US 6,686,808 B1
(45) Date of Patent: Feb. 3, 2004

(54) COPLANAR STRIPLINE WITH CORRUGATED STRUCTURE

(75) Inventors: Satoru Sugawara; Koji Mizuno, both of Sendai (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/329,343

(22) Filed: Jun. 10, 1999

(30) Foreign Application Priority Data

Jun. 15, 1998 (JP) ............................. 10-166939

(51) Int. Cl.⁷ ................................. H01P 3/08
(52) U.S. Cl. ............................. 333/1; 333/238
(58) Field of Search ................ 333/1, 238, 246

(56) References Cited

U.S. PATENT DOCUMENTS

| | | | | |
|---|---|---|---|---|
| 4,178,568 A | * | 12/1979 | Gunton | 333/238 X |
| 4,394,630 A | * | 7/1983 | Kenyon et al. | 333/238 X |
| 4,521,755 A | * | 6/1985 | Carlson et al. | 333/246 X |
| 5,157,364 A | * | 10/1992 | Pond et al. | 333/246 X |

OTHER PUBLICATIONS

Text of an oral presentation by Satoru Sugawara et al.; IEEE MTT–S International Microwave Symposium held in Baltimore, Maryland on Jun. 10, 1998; entitled: "Characteristics of a MM–Wave Tapered Slot Antenna With Corrugated Edges"; 4 pages.

* cited by examiner

*Primary Examiner*—Benny Lee
(74) *Attorney, Agent, or Firm*—Oblon, Spivak, McClelland, Maier & Neustadt, P.C.

(57) ABSTRACT

A coplanar stripline is provided, including a dielectric substrate, and first and second strip conductors, which are each formed on the dielectric substrate, parallel to each other and separated by a predetermined distance. The corrugated structure is formed at least on one side of the strip conductors, including a plurality of slits. The slits are formed periodically on the side of each of the strip conductors, which is located in the outside portion thereof and not facing the other confronting strip conductor, so that the length direction of the slit is substantially perpendicular to the direction of the electromagnetic wave transmitted through the coplanar stripline.

7 Claims, 7 Drawing Sheets

COPLANAR STRIPLINE WITH CORRUGATED STRUCTURE

CROSS-REFERENCE TO RELATED APPLICATIONS

The present invention claims priority and contains subject matter related to Japanese Patent Application No. 10-166939, filed with the Japanese Patent Office on Jun. 15, 1998, the entire contents of which are hereby incorporated by reference.

BACKGROUND OF THE INVENTION

1. Field of the Invention

The present invention relates to a coplanar stripline for use in high-frequency transmission, particularly to the stripline provided with a corrugated structure, having an improved transmission capability.

2. Description of the Background

A coplanar stripline is known as a transmission line for high frequency electromagnetic waves such as those in microwave and millimeter wave regions, which has been incorporated in a monolithic microwave integrated circuit (MMIC) and microwave integrated circuit (MIC). The stripline is a coplanar type of the distributed constant circuit, which is constituted of a pair of strip conductor lines.

FIG. 4 illustrates electromagnetic field lines, or electric field and magnetic field component lines for the electromagnetic wave during the propagation. Referring to FIG. 4, a coplanar line 104 is composed of a pair of strip conductors 102,103, each formed on a dielectric substrate 101 parallel to each other and separated by a predetermined distance. The construction of conductors in the coplanar striplines may thus be considered complimentary to that of the prior art coplanar waveguide.

The field lines includes the components of the electric field 401 and magnetic field 402, of the electromagnetic wave, respectively. As shown in FIG. 4, it is known the components of the electric field 401 and magnetic field are located primarily in the area between, and surrounding, the strip conductors 102,103, respectively.

The coplanar striplines have not been used often for several reasons such as a transmission loss larger than that of either micro striplines or coplanar waveguides and a difficulty caused by a complicated signal transfer to microstrip lines.

Technological advances in the area of MMIC packaging are rapidly reducing the size of high frequency electronic assemblies. The distance of signal transmission is therefore reduced in the miniaturized circuits, and the transmission loss described above is becoming less significant.

In addition, along with the recent trend of the main stream of the high-frequency circuits toward uniplanar circuits from the previous circuits including microstrip lines, coplanar striplines and slot lines have been attracting much attention recently. Being able to be constructed with finite breadth of conductors, the coplanar striplines, in particular, are considered more advantageous, in principle, for miniaturization in contrast to the coplanar waveguides and slotlines, for which conductor strips of semi-infinite breadth have to be generally assumed.

Although the coplanar striplines are considered advantageous for the miniaturization because of finite breadth of conductors, as described above, the present inventors have realized shortcomings thereof, in that a plurality of the known coplanar striplines can not be disposed in close vicinity to each other or densely such as in an integrated circuit, because of the disturbance by crosstalk between the striplines. The present finding is based on the fact that the distribution of the electric field 401 and magnetic field 402, of the electromagnetic wave of the present propagation mode, is somewhat different from the distribution shown previously in FIG. 4.

As described earlier, the electric field components 401 have been considered to be located primarily in the area between the strip conductors 102,103, as shown in FIG. 4.

FIG. 5 is a perspective view of a coplanar stripline accompanied by an electric field 401 (represented by solid lines) and a magnetic field 402 (represented by dashed lines.

Referring now to FIG. 5, the difference mentioned above will be detailed hereinbelow, and is resolved by the present inventors. In addition to the electric field components 401 located primarily in the area between the strip conductors 102,103 (FIG. 4), the present inventors have found an additional, concentrated distribution of the electric field component exists in the outside portion of the coplanar striplines 104.

By the term "outside portion", it is meant a side edge portion of each of the strip conductors 102,103, which is positioned longitudinally and not facing to the other confronting strip conductor of the coplanar stripline. These side portions are shown in FIG. 5, as the left-hand side of the strip 102 and the right-hand side of the strip 103 both located on dielectric substrate 101.

These side edge portions are hereinafter referred to as the outside portions, while the inside portions are those facing to the side edge of the other confronting strip conductor.

Referring now to FIG. 5, when an intense electric field 501 is applied to the outside portions of the strip conductors 102,103, this gives rise to a large crosstalk between the neighboring stripline which is disposed in close vicinity to each other, to thereby cause a problem, in that a plurality of planar striplines can not be disposed close together. In such a circumstance, therefore, the aforementioned advantage for the coplanar stripline can not be fully utilized, for which a finite breadth for the strip conductor can be assumed, and therefore it cannot be any longer considered advantageous for achieving the miniaturization of the circuits.

The electric field distribution in FIG. 5 is originated from the distribution of electric current flows illustrated in FIG. 6, in which a plurality of the arrows 601,602 designate the current flows including their direction. The current flows 601 are known previously to correspond to the electric field 401 of FIG. 4 which is located in the in-between portions of the strip conductors 102,103 both located on dielectric substrate 101, while other current flows 602 correspond to the electric field distribution applied to the outside portions of the strip conductors 102,103.

As clearly seen from the arrows for illustrating the current flows shown in FIG. 6, there exist the current flows along the length of the strip conductor not only in the inside portions, but also in the outside portions, of the strip conductors 102,103. The electric field 501 shown in FIG. 5 is thus induced by the current flows 602, thereby causing crosstalks between the neighboring striplines.

SUMMARY OF THE INVENTION

It is therefore an object of the present invention to provide a coplanar stripline, which overcomes the above-noted difficulties.

It is another object to provide coplanar striplines which is provided with a corrugated structure including a plurality of slits, having an improved transmission capability.

To achieve the foregoing and other objects, and to overcome the shortcomings discussed above, a coplanar stripline is provided for transmitting electrical data signals, including a dielectric substrate and a plurality of strip conductors formed on the dielectric substrate, substantially parallel to one another and separated by a predetermined distance. At least on one side of the strip conductors, a corrugated structure is provided, including a plurality of slits formed on the side of the strip conductor, so that the length direction thereof is substantially perpendicular to the direction of the electromagnetic wave transmitted through the coplanar stripline.

According to one aspect disclosed herein, a coplanar stripline is provided for transmitting electrical data signals, including a dielectric substrate, and first and second strip conductors formed on the dielectric substrate, substantially parallel to each other and separated by a predetermined distance. At least on one side of the strip conductors, a corrugated structure is provided, including a plurality of slits formed periodically on the side of the strip conductors, located in the outside portion of the stripline and not facing to the other confronting strip conductor, so that the length direction of the slit is substantially perpendicular to the direction of the electromagnetic wave transmitted through the coplanar stripline.

According to another aspect disclosed herein, the corrugated structure is formed so as to satisfy a first condition expressed by the equation $$CL > \lambda/10,$$

where CL is the depth of the slit and $\lambda$ is the effective wavelength of the electromagnetic wave which is currently transmitted through the coplanar stripline.

According to still another aspect disclosed herein, the corrugated structure is formed so as to satisfy a second condition expressed by the equations $$CP-CW < \lambda/4 \text{ and } CW < \lambda/4,$$

where CP and CW are the period and width of the slit, respectively.

According to another aspect disclosed herein, the corrugated structure is formed so as satisfy a third condition expressed by the equation $$CL > CW.$$

With the coplanar stripline disclosed herein, having the corrugated structure formed periodically on the outside portions of the strip conductor, the current flows along the length of the conductors in the outer edge portions of the strip conductors and the electric field induced in those portions can be suppressed, to thereby reduce the crosstalk between the coplanar striplines. A denser circuit alignment with a plurality of striplines therefore becomes feasible.

BRIEF DESCRIPTION OF THE DRAWINGS

Preferred embodiments will be described in detail with reference to the following drawings in which like reference numerals refers to like elements and wherein.

DESCRIPTION OF THE PREFERRED EMBODIMENTS

Figure 1:
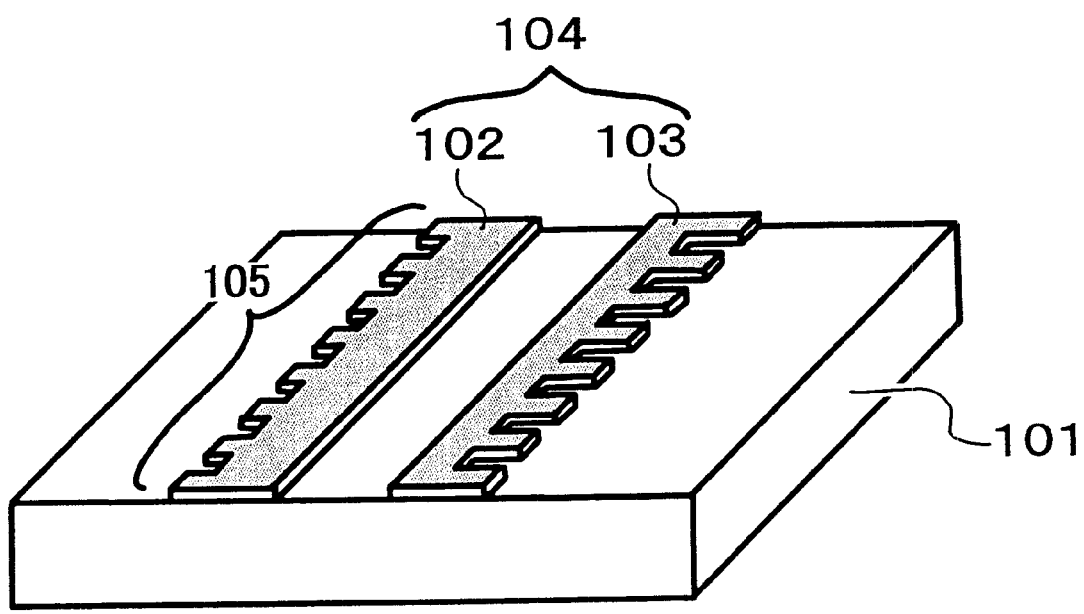
FIG. 1 is a perspective view of a coplanar stripline disclosed herein.
Figure 2:
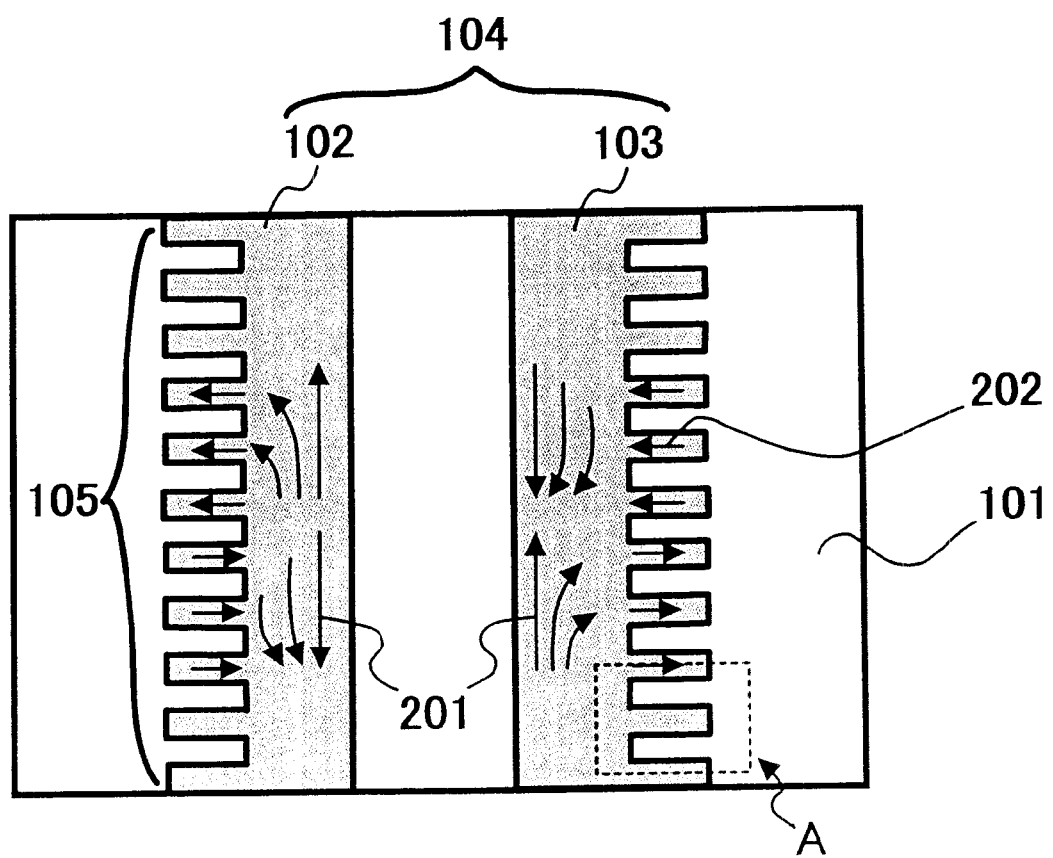
FIG. 2 is a top view of the coplanar stripline of FIG. 1.

FIGS. 1 and 2 are perspective and top views of a coplanar stripline, respectively, disclosed herein.

The coplanar stripline includes first and second strip conductors 102,103, which are disposed on a dielectric substrate 101, parallel to each other and separated by a predetermined distance, to constitute the coplanar stripline 104 as a pair of strip conductors 102, 103, as described earlier.

On the side of each strip conductors 102,103, which is located in the outside portions of the stripline end not facing to the other confronting strip conductor, there is formed a corrugated structure 105, having a plurality of slits periodically provided on the side of each strip conductor, as illustrated in FIGS. 1 and 2. The direction of a current flow and the distribution of current density on the strip conductors 102,103 during transmission are shown by arrows 201, 202 in FIG. 2, respectively.

Figure 3:
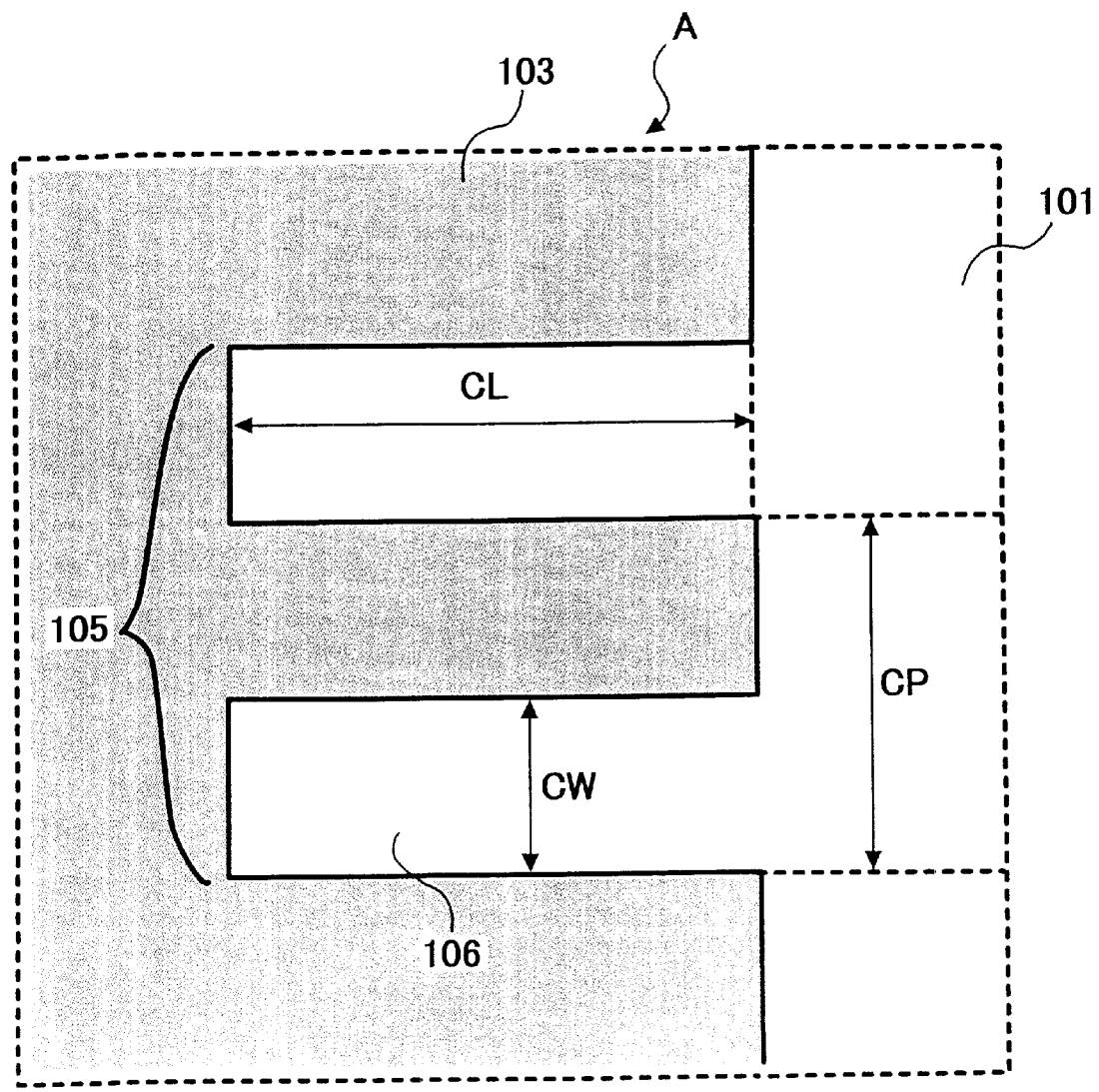
FIG. 3 is an enlarged view of the enclosed portion "A" of the coplanar stripline in FIG. 2.
Figure 4:
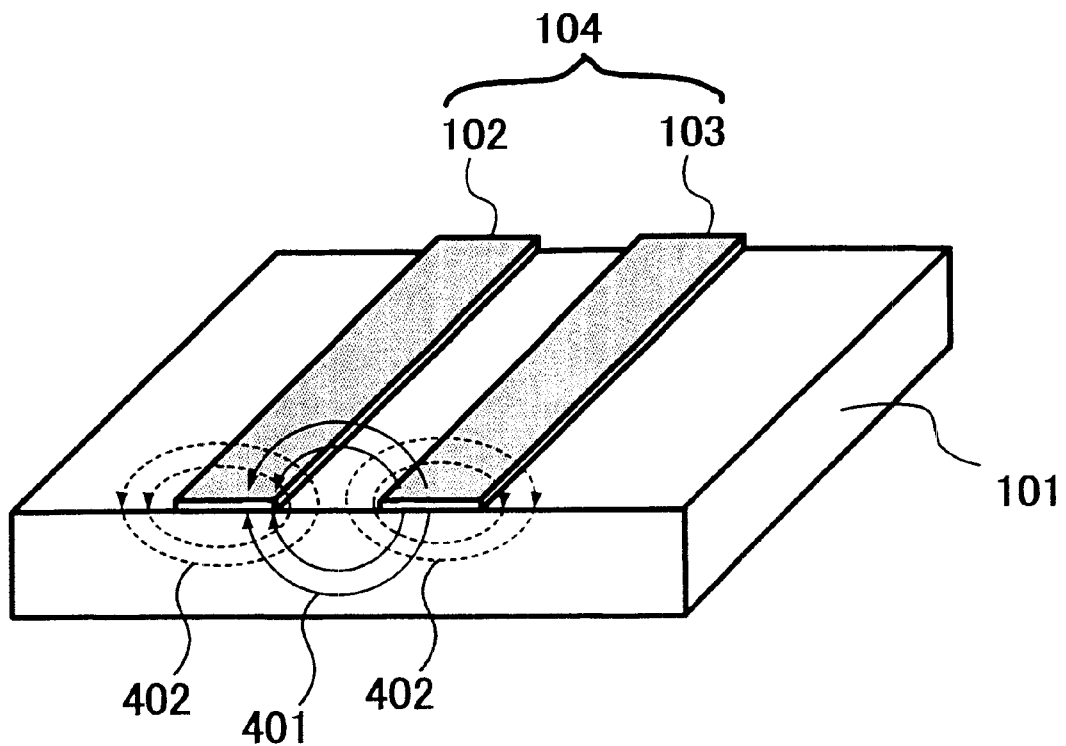
FIG. 4 is a perspective view of a prior art coplanar stripline accompanied by electric and magnetic field lines.

FIG. 3 is an enlarged view of the enclosed portion "A" of the coplanar stripline in FIG.2, which is included to further illustrate the corrugated structure 105.

Referring to FIG. 3, the structure 105 includes the aforementioned slits formed periodically on the outside portions of the strip conductor 103, in which the slits 106 each has a depth (or length) CL, width CW and period CP. That is, the slits 106 (shown in FIGS. 1 through 3) are formed with a constant spatial period of CP.

With the corrugated structure 105 formed periodically on the outside portions of the strip conductors 102,103, the direction and magnitude of a current flow in the outer edge portions of on the strip conductors 102,103 are confined in a manner shown by the arrows 202 in FIG. 2.

Figure 6:
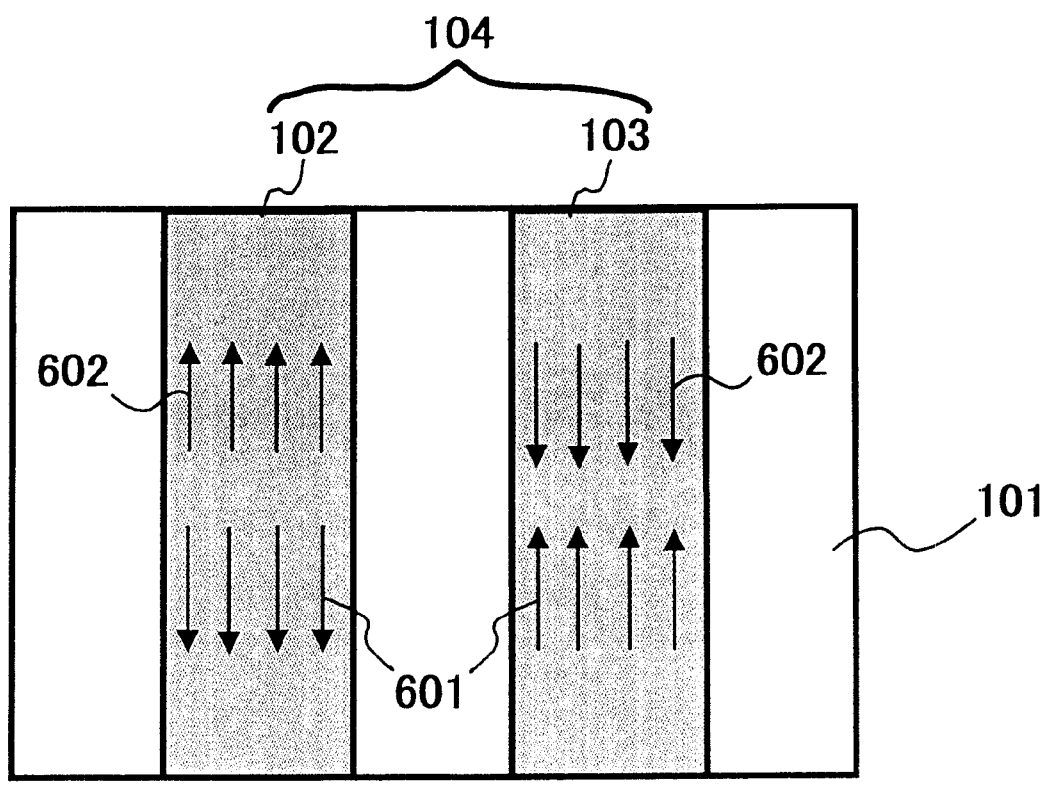
FIG. 6 is a top view of the prior art coplanar stripline of FIG. 4, showing electric current flows on the stripline.

As a result, current flows with the longitudinal direction to the length of the conductor 102,103 can be eliminated in the edge portions, which otherwise persists as those shown by the arrows 602 in FIG. 6.

Additionally, because the slits 106 are formed periodically on the outside portions of the strip conductor 102,103 with a period CP as shown in FIGS. 1–3, it may be noted that a uniform current distribution can be achieved, that is, without any difference in the current distribution from one portion to the other, either along the length of the conductors or between strip conductors.

Figure 5:
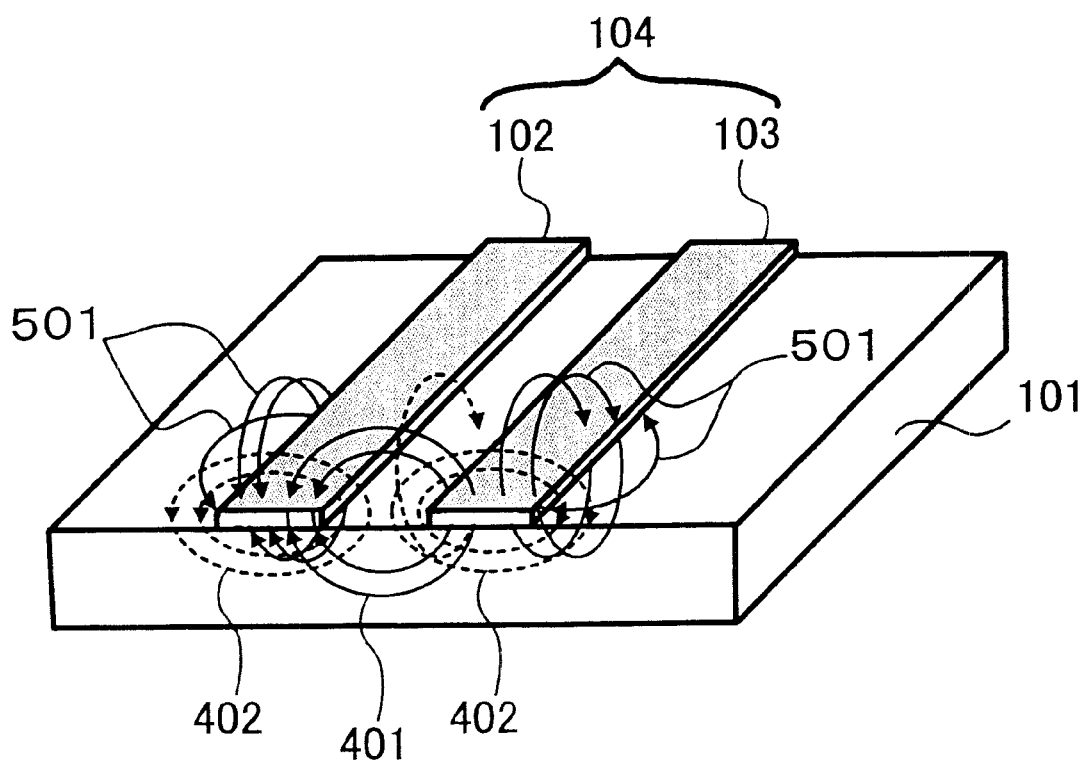
FIG. 5 is a further perspective view of the art prior coplanar stripline of FIG. 4, accompanied by electric and magnetic field lines which are clarified by the present inventors.

As described above, since the current flows are thus confined in the outer edge portions of on the strip conductors 102,103, this causes the electric field 501 (FIG. 5) in those portions to be suppressed. As a result, it becomes feasible to reduce crosstalk between neighboring striplines.

In order to function properly in a coplanar stripline, a corrugated structure 105 is preferably fabricated such that CL and $\lambda$ satisfy the first condition expressed by the equation $$CL > \lambda/10,$$

where CL is the depth of a slit 106 (FIG. 3) formed in the strip conductor and λ is the effective wavelength of the electromagnetic wave which is currently transmitted through the coplanar stripline. This relationship is derived on the basis of the general theory in the art.

Further, it is preferred also from the theory that the corrugated structure 105 is fabricated, in practice, such that CL and λ satisfy the equation:

$$(\text{width of strip conductor}) - CL > \lambda/10.$$

To reduce the current flow along the length of the conductors in the outside portions of the strip conductors 102,103, the corrugated structure 105 is fabricated preferably such that the width CW and period CP, of the slit 106 and the effective wavelength λ satisfy the second condition expressed are by the equation:

$$CP - CW < \lambda/4$$

and $$CW < \lambda/4.$$

The basis for this relationship is the fact that the direction of the current flow is reversed with a spatial period of λ/4. Therefore, by fabricating the corrugated structure 105 such that the width CW of the slit 106 is smaller than the spatial period λ/4, the direction of the current flow along the length of the strip conductors can be changed in the outside edge portions of on the strip conductors 102,103.

Further, in order to suppress the current flow along the length of the conductors more effectively, the corrugated structure 105 is preferably fabricated such that CL and CW satisfy the third condition expressed by the equation $$CL > CW,$$

where CL is the depth of the a slit 106 (or the length along the current flow) and CW is the width along the direction for suppressing the current flow.

It is known that eigen modes of the currents are induced for high frequency currents transmitted through a conductor, depending upon the size and shape of the conductor and that the frequency corresponding to the lowest accessible mode is determined by either CL or CW, whichever is larger. By rendering CL>CW, therefore, a characteristic mode along the CL direction becomes stable, to thereby be able to control the current in a desired direction.

Still further, in order to suppress more effectively the current flow along the length of the conductors, the slits 106 of the corrugated structure 105 are each formed preferably such propagation that the length direction of the slit is substantially perpendicular to the direction of for the electromagnetic wave which is currently transmitted through the coplanar stripline (i.e., the fourth condition).

The slit 106, formed in the above-described manner makes it possible to confine the direction of the current flow 202 in the outer edge portions along the length of on the strip conductors 102,103 such that the component of the current 202 along that direction is zero.

As disclosed herein, a coplanar stripline 105 such as shown in FIGS. 1–3 was fabricated so as to conform the aforementioned four conditions for 35 GHz range electromagnetic waves, for which an effective wavelength of 3.77 mm is assumed.

To be more specific, the coplanar stripline 105 was fabricated as follows. A dielectric substrate 101 (see FIGS. 1–3) made of Duroid 6010™ from Rogers Corp with a dielectric constant of 10.2, has a thickness of 0.76 mm. Through conventional masking and etching process steps, a pair of strip conductors 102,103 were formed on the substrate, each having a thickness and a width of 18 microns and 0.82 mm, respectively, and separated each other by a distance of 0.14 mm.

In addition, a plurality of slits were formed in the outer edge portions of the strip conductors 102,103, to be substantially perpendicular to the propagation direction of electromagnetic waves, each having a depth CL of 0.4 mm, width CW of 0.2 mm and spatial period CP of 0.4 mm, whereby a corrugated structure 105 was formed.

Since the depth CL and width CW were 0.4 mm and 0.2 mm, respectively, with this slit construction, the aforementioned first (CL>λ/10) end second (CP–CW<λ/4 and CW<λ/4) conditions were found fulfilled for the present effective wavelength of 3.77 mm. In addition, the third condition (CL>CW) was also satisfied.

Further, since the slits 106 are each formed such that its length direction is substantially perpendicular to the direction of propagation for the present electromagnetic wave as shown in FIGS. 1–3, the fourth condition was also fulfilled.

With the structure of the coplanar stripline, having the dimension described just above, the reduction of crosstalk between neighboring striplines can be achieved.

According to the embodiment for the coplanar stripline disclosed herein, having the corrugated structure 105 formed periodically on the outside portions of the strip conductor 102,103, the current flows along the length of the conductors in the outer edge portions of on the strip conductors and the electric field 501 in those portions described earlier referring to FIG. 5 can be suppressed. Therefore, with the reduced field and the concomitant decrease in crosstalk between the neighboring striplines, a denser circuit alignment with a plurality of striplines becomes feasible.

While the present invention so described with reference to particular embodiments, these embodiments are intended to be illustrative, not limiting.

In particular, other dielectric substrates may also be used, having characteristics such as dielectric constant and thickness, other than those described above, and other frequencies may also be assumed for forming a coplanar striplines. In addition, although the corrugated structure was described, having rectangular shaped slits thereon as shown in FIGS. 1–3, other shapes of the slits may also be utilized alternately as long as the slit is effective for realizing the desired characteristics of the coplanar stripline of the present invention.

Figure 7:
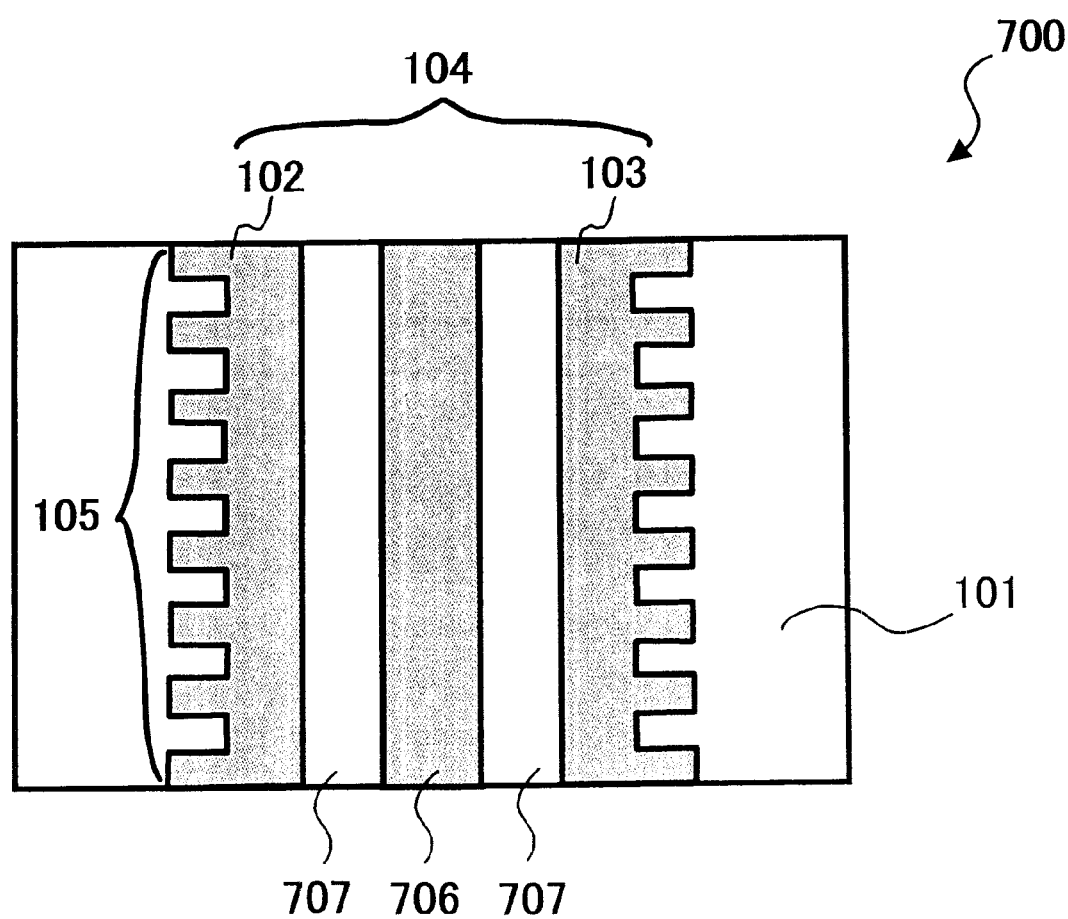
FIG. 7 is a top view of a coplanar waveguide with finite ground planes disclosed herein.

Further still, although the above examples are detailed primarily on the coplanar stripline consisting of a pair of strip conductor lines 102,103 the corrugated structure 105 may be effective also for a coplanar waveguide 700 which consists of a center conductor 706 accompanied by a pair of ground planes 707 and in which the width of the ground planes 707 each are not infinite, but practically limited to a finite length. This is illustrated in FIG. 7 as a corrugated coplanar waveguide with finite ground planes 707.

As will be apparent from the above description including the example, with the coplanar stripline 104 disclosed herein, having the corrugated structure 105 formed periodically on the outside portions of the strip conductor 102,103 the current flow along the length of the conductors 102,103 in the outer edge portions of the strip conductors 102, 103 and the electric field 701 induced in those portions can be suppressed, to thereby reduce the crosstalk between the coplanar striplines. A denser circuit alignment with a plurality of striplines therefore becomes feasible.

Additional modifications to, and variations of, the embodiments described above may be made without departing from the spirit and the scope of the present invention as defined in the appended claims.

What is claimed is:

1. A coplanar stripline for transmitting electric component data signals of an electromagnetic wave, said coplanar stripline comprising:

a dielectric;

a plurality of strip conductors formed on said dielectric for transmitting the electric component data signals, substantially parallel to one another and separated by a predetermined distance;

a corrugated structure provided on at least a first side of said plurality of strip conductors, said corrugated structure including a plurality of slits formed on said first side of each of said plurality of strip conductors, so that a length direction thereof is substantially perpendicular to a direction of the electromagnetic wave transmitted through said coplanar stripline, wherein said corrugated structure is formed so as to satisfy a condition expressed by equations as follow:

$$CP-CW<\lambda/4$$

and $$CW<\lambda/4.$$

where CP and CW are a period and a width of each of said plurality of slits, respectively.

2. The coplanar stripline according to claim 1, wherein said corrugated structure is formed so as to satisfy a condition expressed by an equation:

$$CL>\lambda/10,$$

where CL is a depth of each of said plurality of slits and λ is an effective wavelength of the electromagnetic wave which is currently being transmitted through said coplanar stripline.

3. The coplanar stripline according to claim 1, wherein said corrugated structure is formed so as to satisfy a condition expressed by an equation:

$$CL>CW.$$

4. A coplanar stripline for transmitting electric component data signals of an electromagnetic wave, said coplanar stripline comprising:

a dielectric;

first and second strip conductors formed on said dielectric, parallel to each other and separated by a predetermined distance; and a corrugated structure provided on at least a first side of said first and second strip conductors, said corrugated structure including a plurality of slits which are formed periodically on said first side of each of said first and second strip conductors, located in an outside portion of said coplanar stripline and not facing another confronting strip conductor, so that a length direction of each slit of said plurality of slits is substantially perpendicular to a direction of the electromagnetic wave transmitted through said coplanar stripline, to satisfy first, second, third, and fourth equations:

$$CL>\lambda/10, CP-CW<\lambda/4, CW<\lambda/4,$$

and $$CL>CW,$$

respectively, where CL, CW, and CP are a depth, a width, and a period of each of said plurality of slits, respectively, and λ is an effective wavelength of the electromagnetic wave which is currently being transmitted through said coplanar stripline.

5. A coplanar stripline for transmitting electric component data signals of an electromagnetic wave, said coplanar stripline comprising:

a dielectric;

first and second strip conductors formed on said dielectric, substantially parallel to each other and separated by a predetermined distance; and a corrugated structure provided on at least a first side of said first and second strip conductors, said corrugated structure including a plurality of slits formed periodically on said first side of each of said first and second strip conductors, located in an outside portion of said coplanar stripline and not facing another confronting strip conductor, so that a length direction of each slit of plurality of slits is substantially perpendicular to a direction of the electromagnetic wave transmitted through said coplanar stripline, wherein said corrugated structure is formed so as to satisfy a condition expressed by equations as follows:

$$CP-CW<\lambda/4$$

and $$CW<\lambda/4,$$

where CP and CW are a period and a width of each of said plurality of slits, respectively.

6. The coplanar stripline according to claim 5, wherein said corrugated structure is formed so as to satisfy a condition expressed by an equation:

$$CL>\lambda/10,$$

where CL is a depth of each of said plurality of slits and λ is an effective wavelength of the electromagnetic wave which is currently being transmitted through said coplanar stripline.

7. The coplanar stripline according to claim 5, wherein said corrugated structure is formed so as to satisfy a condition expressed by an equation:

$$CL>CW.$$

* * * * *